United States Patent
Nagamine et al.

(10) Patent No.: US 9,640,584 B2
(45) Date of Patent: May 2, 2017

(54) METHOD OF MANUFACTURING A MAGNETORESISTIVE MEMORY DEVICE

(71) Applicants: Makoto Nagamine, Seoul (KR); Youngmin Eeh, Seoul (KR); Koji Ueda, Seoul (KR); Daisuke Watanabe, Seoul (KR); Kazuya Sawada, Seoul (KR); Toshihiko Nagase, Seoul (KR)

(72) Inventors: Makoto Nagamine, Seoul (KR); Youngmin Eeh, Seoul (KR); Koji Ueda, Seoul (KR); Daisuke Watanabe, Seoul (KR); Kazuya Sawada, Seoul (KR); Toshihiko Nagase, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/645,239

(22) Filed: Mar. 11, 2015

(65) Prior Publication Data
US 2016/0099287 A1 Apr. 7, 2016

Related U.S. Application Data

(60) Provisional application No. 62/059,076, filed on Oct. 2, 2014.

(51) Int. Cl.
| | | |
|---|---|---|
| *H01L 21/00* | (2006.01) | |
| *H01L 43/00* | (2006.01) | |
| *H01L 27/22* | (2006.01) | |
| *H01L 43/08* | (2006.01) | |
| *H01L 43/12* | (2006.01) | |

(52) U.S. Cl.
CPC .............. *H01L 27/228* (2013.01); *H01L 43/08* (2013.01); *H01L 43/12* (2013.01)

(58) Field of Classification Search
CPC . H01L 27/228; H01L 27/0605; H01L 27/247; H01L 43/02; H01L 43/08; H01L 43/12; H01L 43/10
See application file for complete search history.

(56) References Cited

U.S. PATENT DOCUMENTS

| | | | | |
|---|---|---|---|---|
| 6,815,784 B2 * | 11/2004 | Park et al. | ..................... | 257/421 |
| 7,816,255 B2 * | 10/2010 | Choi et al. | ..................... | 438/627 |
| 8,194,362 B2 * | 6/2012 | Ibusuki | .................. | B82Y 10/00 |
| | | | | 360/324.1 |
| 8,445,979 B2 * | 5/2013 | Oh | ......................... | B82Y 25/00 |
| | | | | 257/421 |
| 8,680,632 B2 | 3/2014 | Daibou et al. | | |
| 8,750,029 B2 | 6/2014 | Kitagawa et al. | | |

(Continued)

OTHER PUBLICATIONS

Lide, "Magnetic susceptibility of the elements and inorganic compounds", (Dec. 2005). CRC Handbook of Chemistry and Physics. Boca Raton (FL): CRC Press, pp. 4-130-4-135. (Dec. 2005).*

(Continued)

*Primary Examiner* — Nikolay Yushin
(74) *Attorney, Agent, or Firm* — Holtz, Holtz & Volek PC

(57) ABSTRACT

According to one embodiment, a magnetoresistive memory device, includes a metal buffer layer provided on a substrate, a crystalline metal nitride buffer layer provided on the metal buffer layer, and a magnetoresistive element provided on the metal nitride buffer layer. The metal nitride buffer layer and the metal buffer layer contain a same material.

11 Claims, 8 Drawing Sheets

(56) References Cited

U.S. PATENT DOCUMENTS

2003/0222322 A1* 12/2003 Park et al. .................. 257/421
2008/0274610 A1* 11/2008 Choi et al. .................. 438/653
2012/0070695 A1    3/2012 Kitagawa et al.
2012/0244639 A1    9/2012 Ohsawa et al.
2014/0131824 A1    5/2014 Kitagawa et al.

OTHER PUBLICATIONS

Anonimous, Technical data for Tantalum, http://www.periodictable.com/Elements/073/data.html, published on Nov. 11, 2007.*
Related U.S. Appl. No. 14/201,263, First Named Inventor: Masahiko Nakayama, filed Mar. 7, 2014, Title: "Magnetic Memory and Method of Manufacturing the Same".

* cited by examiner

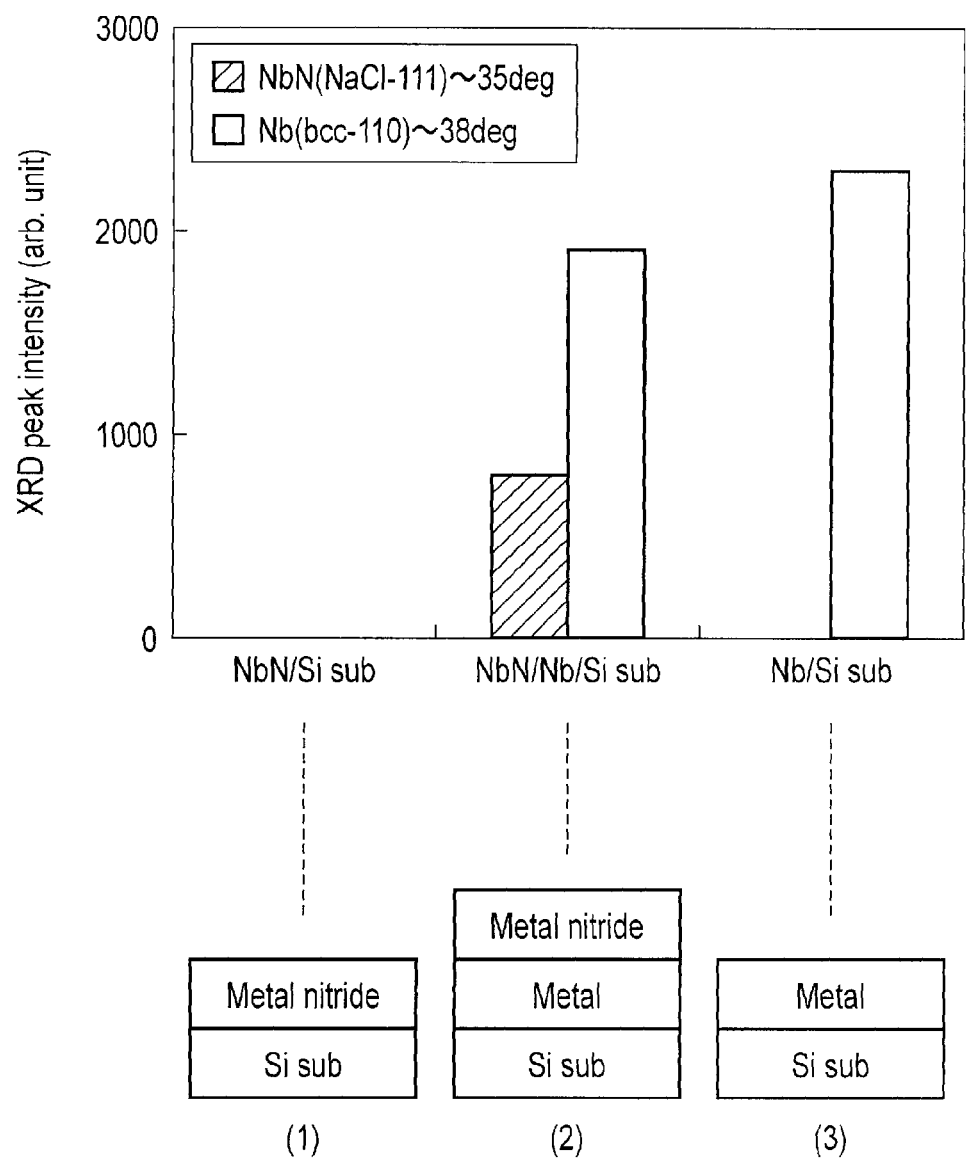
F I G. 1

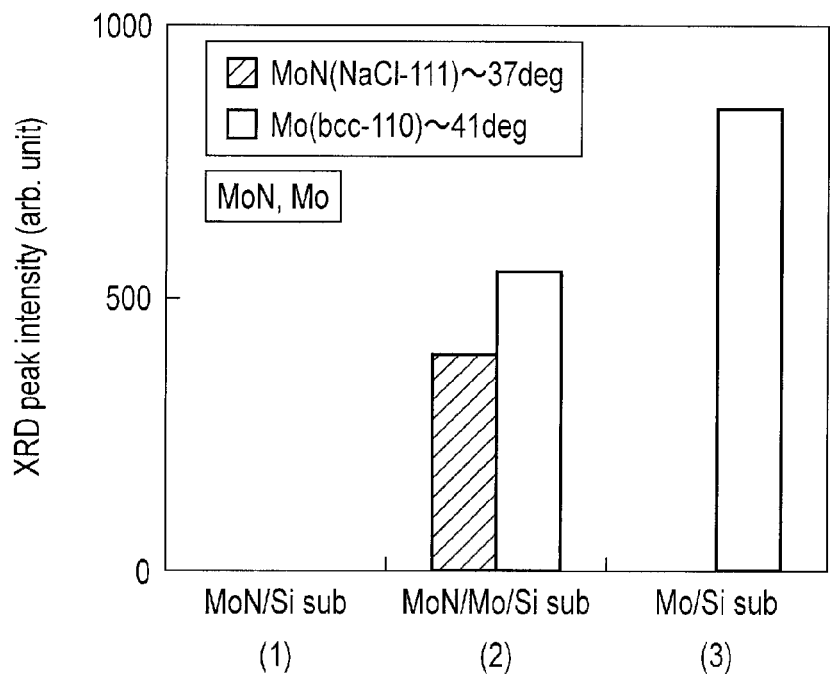
F I G. 2
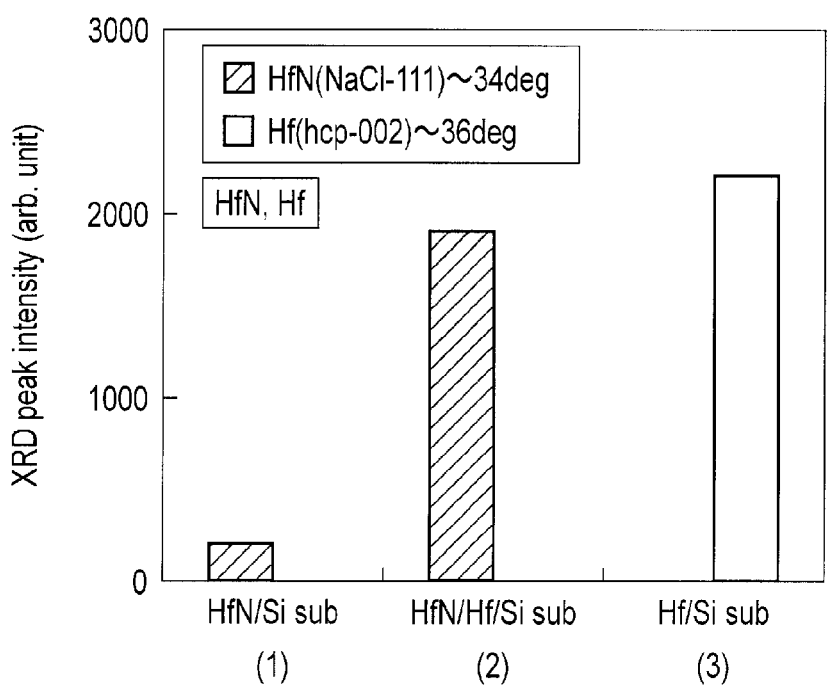
F I G. 3

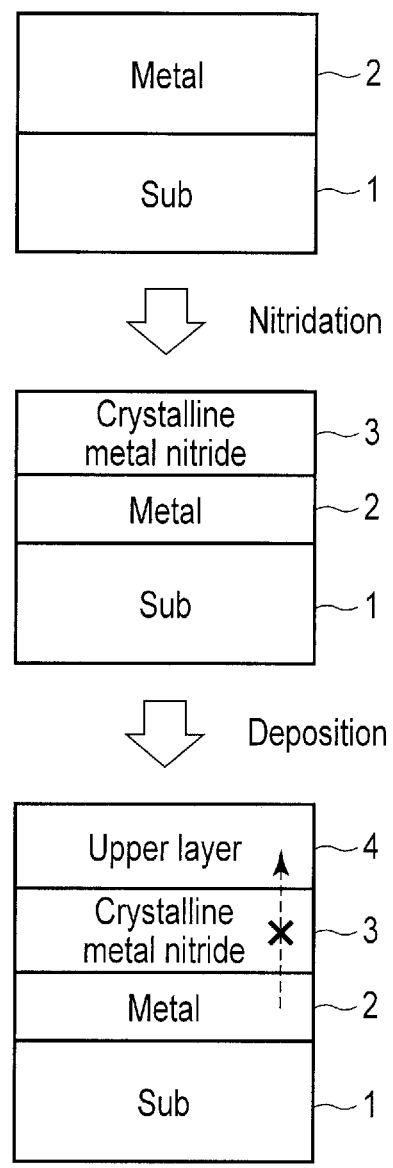
F I G. 4

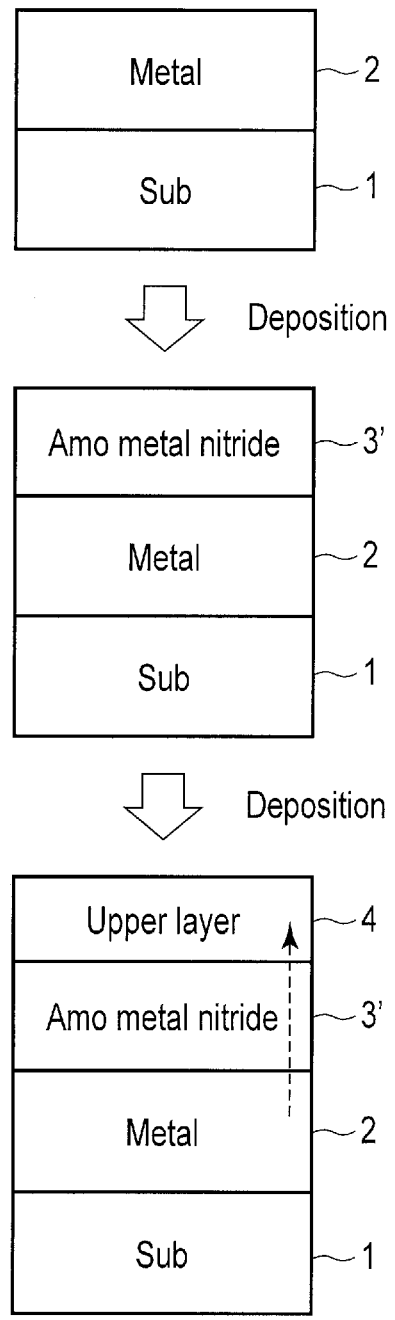
F I G. 5

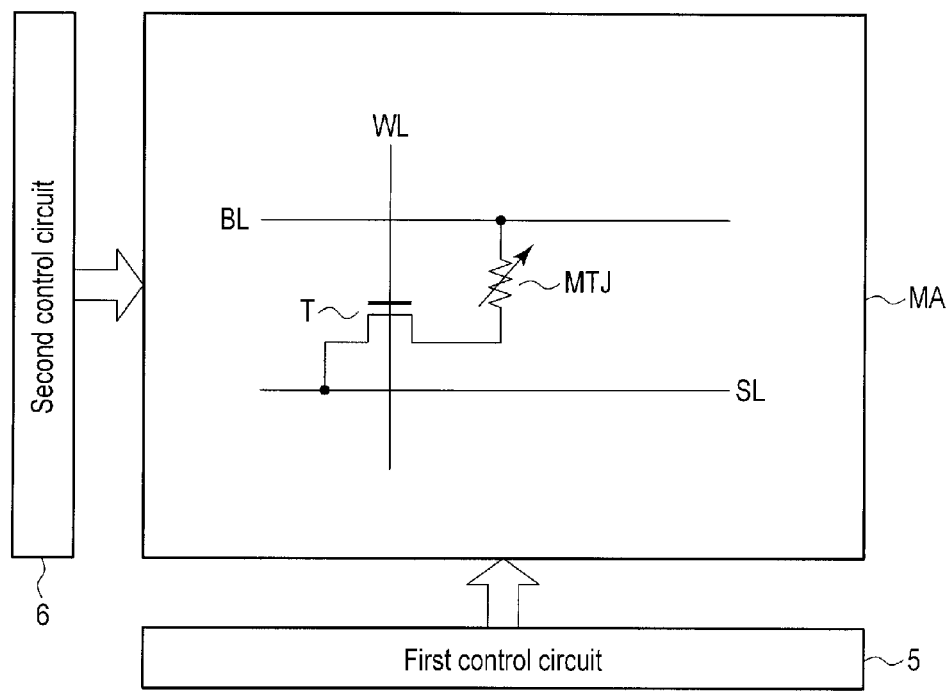
F I G. 6
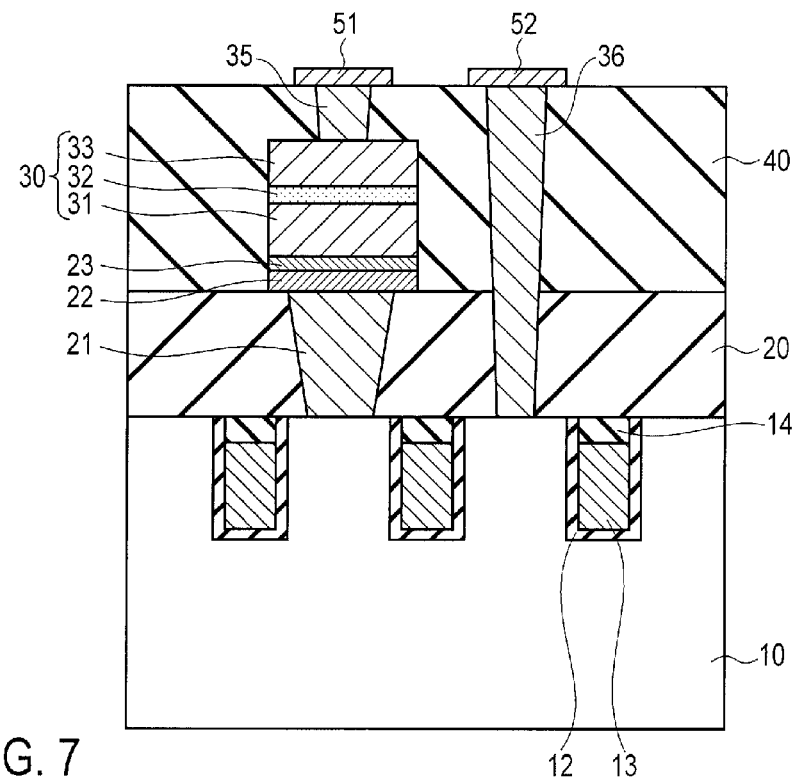
F I G. 7

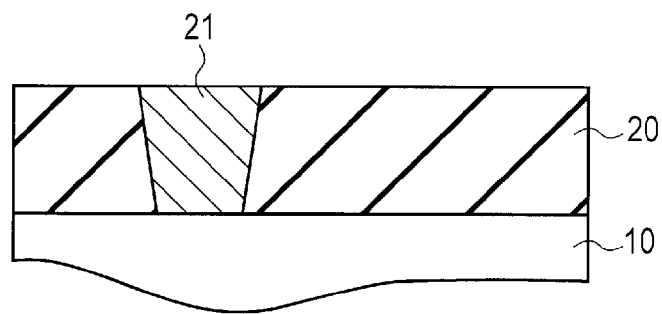
F I G. 8A
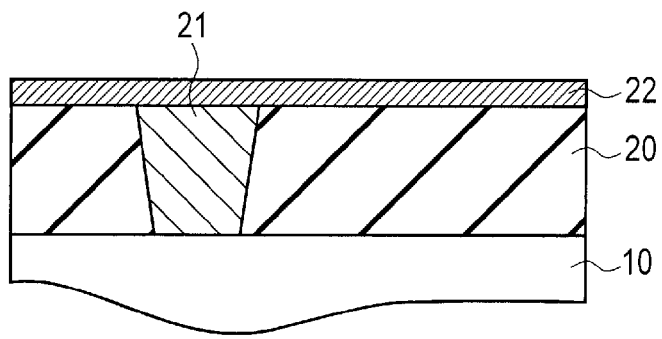
F I G. 8B
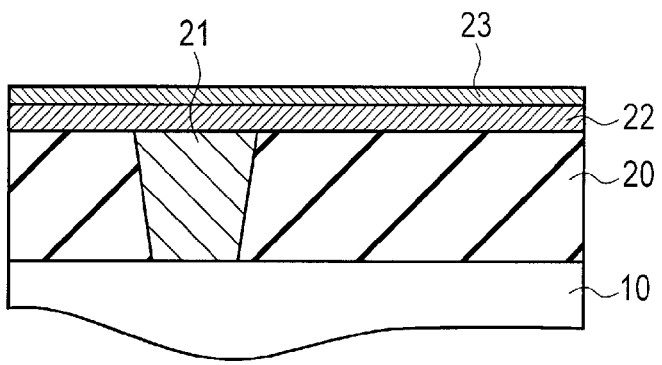
F I G. 8C

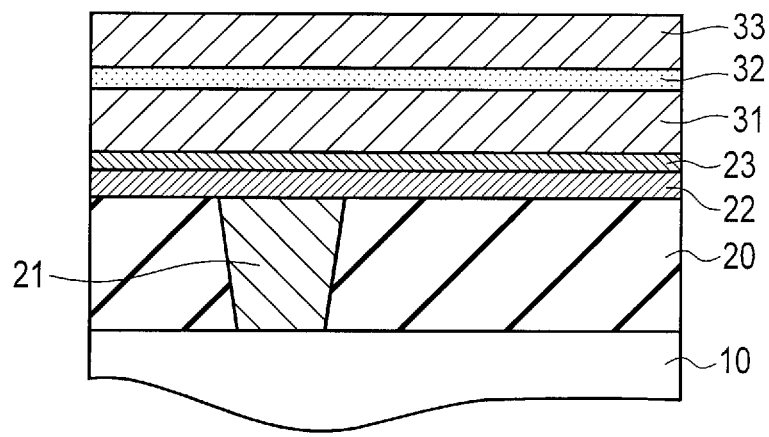
F I G. 8D
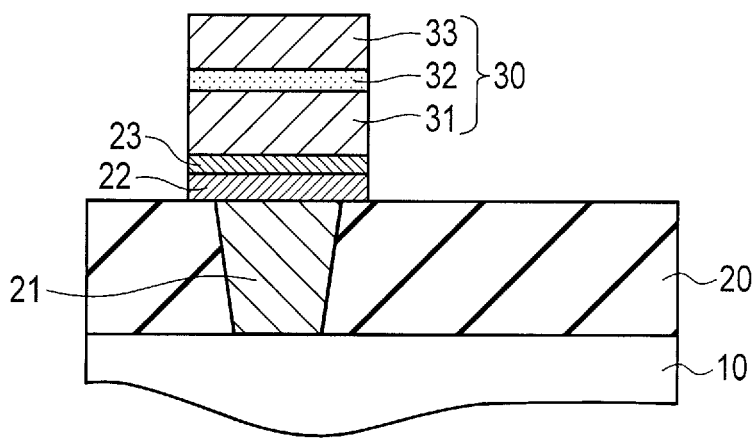
F I G. 8E

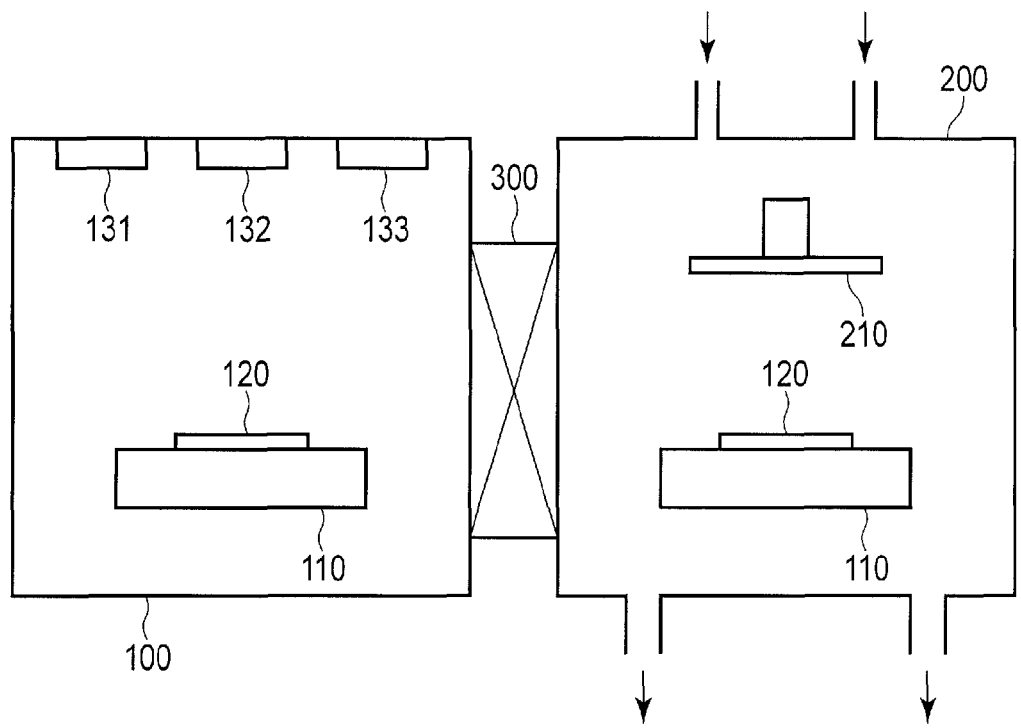
F I G. 9

METHOD OF MANUFACTURING A MAGNETORESISTIVE MEMORY DEVICE

CROSS-REFERENCE TO RELATED APPLICATIONS

This application claims the benefit of U.S. Provisional Application No. 62/059,076, filed Oct. 2, 2014, the entire contents of which are incorporated herein by reference.

FIELD

Embodiments described herein relate generally to a magnetoresistive memory device and a manufacturing method of the same.

BACKGROUND

Recently, a large-capacity magnetoresistive random access memory (MRAM) using a magnetic tunnel junction (MTJ) element has been expected and has attracted attention. In the MTJ element used in the MRAM, one of two ferromagnetic layers sandwiching a tunnel barrier layer is handled as a magnetization-fixed layer (reference layer) which has a magnetizing direction fixed not to be easily varied, and the other is handled as a magnetization free layer (memory layer) which allows a magnetizing direction to be invertible. By associating a parallel state and an antiparallel state of the magnetizing directions of the reference layer and the memory layer with binary numbers "0" and "1", information can be stored.

BRIEF DESCRIPTION OF THE DRAWINGS

FIG. 1 is a schematic drawing showing a relationship between a structure of an Nb-based buffer layer and an XRD peak intensity.

FIG. 2 is a graph showing a relationship between a structure of an Mo-based buffer layer and an XRD peak intensity.

FIG. 3 is a graph showing a relationship between a structure of an Hf-based buffer layer and an XRD peak intensity.

FIG. 4 is an illustration for explanation of a metal nitride film forming method of an embodiment and an effect of the method.

FIG. 5 is an illustration for explanation of a metal nitride film forming method of a comparative example.

FIG. 6 is a circuit configuration diagram showing a memory cell array of an MRAM using a magnetoresistive element of the embodiment.

FIG. 7 is a cross-sectional view showing a structure of a memory cell module using the magnetoresistive element of the embodiment.

FIGS. 8A to 8E are cross-sectional views showing steps of manufacturing the memory cell module shown in FIG. 6.

FIG. 9 is an illustration showing schematic structures of a film forming apparatus and a nitriding apparatus employed in the embodiment.

DETAILED DESCRIPTION

In general, according to one embodiment, a magnetoresistive memory device comprises a metal buffer layer provided on a substrate, a crystalline metal nitride buffer layer provided on the metal buffer layer, and a magnetoresistive element provided on the metal nitride buffer layer. The metal nitride buffer layer and the metal buffer layer contain a same material.

(Embodiments)

Embodiments will be described hereinafter with reference to the accompanying drawings.

An MTJ element used for an MRAM is formed on a substrate on which a select transistor for switching is formed, via a buffer layer. For this reason, a magnetic property of the MTJ element is lowered if crystallinity of the buffer layer is degraded. The crystallinity of the buffer layer therefore needs to be enhanced.

On the other hand, metal diffusion from the buffer layer to a ferromagnetic layer and a tunnel barrier layer needs to be avoided as much as possible. However, if a metal nitride is used as the buffer layer to suppress the metal diffusion, the crystallinity of the buffer layer is degraded.

FIG. 1 is a schematic drawing showing a relationship between a structure (base structure) of an Nb-based buffer layer used for the formation of the MTJ element and an X-ray diffraction (XRD) peak intensity in the buffer layer. The XRD peak intensity corresponds to the crystallinity of the buffer layer. In other words, the peak intensity of the XRD becomes greater as the crystallinity of the buffer layer is good, and the peak intensity of the XRD becomes smaller as the crystallinity of the buffer layer is poor.

As regards NbN in FIG. 1, the peak intensity of 35 deg is seen in the same crystalline structure as NaCl of (111) alignment. As regards Nb, the peak intensity of 38 deg is seen in a body-centered cubic structure (bcc) of (110) alignment.

In a structure (1) in which the buffer layer (NbN) of a metal nitride is formed on a substrate of Si, etc., the peak intensity in the buffer layer is extremely low and is hardly seen. In other words, the crystallinity of the NbN buffer layer is extremely poor. The NbN buffer layer is deposited by, for example, sputtering an Nb target in Ar+N gas.

On the other hand, in a structure (3) in which a metal buffer layer (Nb) is formed on the substrate, the peak intensity in the buffer layer is remarkably high. In other words, the crystallinity of the Nb buffer layer is extremely good. In the Nb buffer layer, however, metal diffusion from the buffer layer to an upper layer (for example, ferromagnetic layer) cannot be avoided.

On the other hand, in a structure (2) in which a buffer layer (NbN) of a metal nitride is formed on the substrate via the metal buffer layer (Nb), both the high peak intensity of Nb and the high peak intensity of NbN can be obtained. This is considered to indicate that the crystallinity of the buffer layer is enhanced. In other words, the NbN buffer layer of good crystallinity can be formed by nitriding a surface of the Nb buffer layer. Incidentally, the Nb buffer layer is formed by sputtering, etc. and the NbN buffer layer is formed by plasma nitriding, etc. of the surface portion of the Nb buffer layer.

If the MTJ element is formed on such an NbN buffer layer of good crystallinity, the magnetic property of the MTJ element is enhanced. In addition, since the NbN buffer layer has good crystallinity, the metal diffusion from the Nb buffer layer to the ferromagnetic layer can be suppressed. For this reason, enhancement of the properties in the MTJ element can be attempted.

The above-described phenomenon can be recognized not only when the Nb-based metal is used as the buffer layer, but when the other metal materials are used for the buffer layer.

FIG. 2 is a graph showing a relationship between a structure (base structure) of an Mo-based buffer layer and an XRD peak intensity in the buffer layer. As regards MoN in FIG. 2, the peak intensity of 37 deg is seen in the same crystalline structure as NaCl of (111) alignment. As regards Mo, the peak intensity of 41 deg is seen in the bcc structure of (110) alignment.

In a structure (1) in which the buffer layer (MoN) of a metal nitride is formed on a substrate of Si, etc., the peak intensity in the MoN buffer layer is extremely low. On the other hand, in a structure (3) in which a metal buffer layer (Mo) is formed on the substrate, the peak intensity in the Mo buffer layer is remarkably high.

On the other hand, in a structure (2) in which a buffer layer (MoN) of a metal nitride is formed on the substrate via the metal buffer layer (Mo), both the high peak intensity of the Mo buffer layer and the high peak intensity of the MoN buffer layer can be obtained. In this case, the MoN buffer layer is formed by nitriding the Mo buffer layer.

FIG. 3 is a graph showing a relationship between a structure (base structure) of an Hf-based buffer layer and an XRD peak intensity in the buffer layer. As regards HfN in FIG. 3, the peak intensity of 34 deg is seen in the same crystalline structure as NaCl of (111) alignment. As regards Hf, the peak intensity of 36 deg is seen in a hexagonal closest packed structure (hcp) of (002) alignment.

In a structure (1) in which the buffer layer (HfN) of a metal nitride is formed on a substrate of Si, etc., the peak intensity in the HfN buffer layer is extremely low. On the other hand, in a structure (3) in which a metal buffer layer (Hf) is formed on the substrate, the peak intensity is remarkably high.

On the other hand, in a structure (2) in which a buffer layer (HfN) of a metal nitride is formed on the substrate via the metal buffer layer (Hf), the high peak intensity of HfN can be obtained. In this case, the HfN buffer layer is formed by nitriding the Hf buffer layer. In addition, the reason why the peak intensity of Hf cannot be obtained in (2) is considered to be that the peak of Hf is buried since all parts of the Hf buffer layer are nitrided or angles of the peak intensities of Hf and HfN are close to each other.

The present embodiment attempts to enhance the magnetic property of the MTJ element by adopting the structure (2). FIG. 4 shows a process of forming the buffer layer serving as the base of the MTJ element of the present embodiment.

First, a crystalline metal film 2 is deposited on a substrate 1 by sputtering, etc. The substrate 1 is, for example, Ta serving as the bottom electrode of the MTJ element and the metal film 2 is Nb serving as the buffer layer. Of course, Mo or Hf may be used instead of Nb. Next, a crystalline metal nitride film 3 is formed by nitriding a surface portion of the metal film 2. For the nitridation of the metal film 2, the metal film may be subjected to thermal treatment in an atmosphere containing N radicals or may be subjected to thermal treatment in a reactive gas atmosphere containing N and H. Further, the metal film may be subjected to thermal treatment in a reactive gas atmosphere containing N and O such as NO, $NO_2$, $N_2O$, etc. After this, a layered structure (upper layer) 4 for the MTJ element is formed on the metal nitride film 3.

In this structure thus formed, the metal diffusion from the metal film 2 to the upper layer 4 can be suppressed owing to presence of the crystalline metal nitride film 3. This is a great benefit that brings about enhancement of heat resistance.

On the other hand, according to a general method shown in FIG. 5, the crystalline metal film 2 is deposited on the substrate 1 by sputtering, etc., then a metal nitride film 3' is deposited on the metal film 2 by sputtering, etc. and the layered structure (upper layer) 4 for the MTJ element is formed on the metal nitride film 3'. Thus, the metal nitride film 3' is formed to be amorphous when the metal nitride film 3' is deposited by not nitridation, but sputtering, etc. For this reason, the metal diffusion from the metal film 2 to the upper layer 4 cannot be prevented.

Crystallization can be promoted by raising the processing temperature at the deposition of the metal nitride film 3'. However, the high temperature treatment like crystallizing of the metal nitridation film 3' is undesirable, in the process of forming the MTJ element. The method shown in FIG. 4 has a merit that the metal nitride film 3 of good crystallinity can be formed without the high temperature treatment.

It should be noted that the metals and nitrides thereof used for the buffer layer have the following crystal systems. Hf has a hexagonal system, HfN has a cubic system, Mo has a cubic system, and MoN also has a cubic system. Nb has a cubic system and NbN has a hexagonal system.

When the metal and the nitride thereof are different with respect to the crystal system, migration of atoms in an interface between the metal and the nitride is inhibited and diffusion of atoms is suppressed. For this reason, using Hf or Nb rather than Mo is preferable. Furthermore, Hf has a greater atomic number and a greater atomic radius than Nb. Therefore, using HfN as the buffer layer is particularly preferable since HfN has a greater diffusion suppression effect than NbN.

Next, an example of applying the present embodiment to an MRAM will be described.

FIG. 6 is a circuit configuration diagram showing a memory cell array of an MRAM using the magnetoresistive element of the present embodiment.

A memory cell in a memory cell array MA comprises a serial connector of an MTJ element serving as a magnetoresistive element and a select transistor (for example, field effect transistor (FET)) T for switching. One of ends of the serial connector (i.e., an end of the MTJ element) is electrically connected to a bit line BL and the other end of the serial connector (i.e., an end of the transistor T) is electrically connected to a source line SL.

A control terminal of the transistor T, for example, a gate electrode of the FET is electrically connected to a word line WL. An electric potential of the word line WL is controlled by a first control circuit 5. In addition, electric potentials of the bit line BL and the source line SL are controlled by a second control circuit 6.

FIG. 7 is a cross-sectional view showing a configuration of a memory cell module using the magnetoresistive element of the present embodiment. A MOS transistor for switching is formed on a surface portion of an Si substrate 10, and an interlayer insulating film 20 is formed on the MOS transistor. The transistor has a buried gate structure in which a gate electrode 13 is buried in a groove formed in the substrate 10 via a gate insulating film 12. The gate electrode 13 is buried in the middle of the groove and a protective insulating film 14 is formed on the gate electrode 13. In addition, source/drain regions (not shown) are formed by diffusing a p-type or n-type impurity in the substrate 10, on both sides of the buried gate structure.

The configuration of the transistor module is not limited to that having the buried gate structure. For example, the gate electrode may be formed on the surface of the Si substrate 10 via a gate insulating film. The configuration of the transistor module may function as a switching element.

A contact hole for connection with a drain of the transistor is formed in the interlayer insulating film 20, and a bottom electrode (BEC) 21 is buried in the contact hole. The bottom electrode 21 is formed of a crystalline metal, for example, Ta.

A crystalline metal film 22 formed of Nb and a crystalline metal nitride film 23 formed of NbN are deposited on the bottom electrode 21. In other words, the structure of the Nb-based buffer layer shown in FIG. 1(2) is formed.

A CoFeB film 31 which is a ferromagnetic magnetization free layer, an MgO film 32 which is a tunnel barrier layer, and a CoFeB film 33 which is a ferromagnetic magnetization fixed layer, are deposited on the buffer layer 22. In other words, an MTJ element 30 is formed by sandwiching the tunnel barrier layer between two ferromagnetic layers. The other film of a metal, a metal nitride, etc. may be sandwiched between the metal nitride film 23 and the MTJ element 30.

An interlayer insulating film 40 is formed over the substrate on which the MTJ element 30 is formed. A contact plug (TEC) 35 connected with the reference layer (CoFeB film) 33 of the MTJ element 30 is buried in the interlayer insulating film 40. In addition, a contact plug 36 connected with a source of the transistor portion is buried into the interlayer insulating films 40 and 20. An interconnect (BL) 51 connected to the contact plug 35 and an interconnect (SL) 52 connected to the contact plug 36 are formed on the interlayer insulating films 40.

Next, a method of manufacturing a memory cell module of the present embodiment will be described with reference to FIGS. 8A to 8E.

First, a MOS transistor (not shown) for switching having a buried gate structure is formed on a surface portion of the Si substrate 10, and the interlayer insulating film 20 of $SiO_2$, etc. is deposited on the Si substrate 10 by CVD, as shown in FIG. 8A. Then, a contact hole for connection with a drain of the transistor is formed in the interlayer insulating film 20, and the bottom electrode 21 of crystalline Ta is buried in the contact hole. More specifically, a Ta film is deposited on the interlayer insulating film 20 by sputtering, etc. to bury the contact hole, and the Ta film is left in the contact hole alone by removing the Ta film on the interlayer insulating film by chemical mechanical etching (CMP).

Next, crystalline metal film 22 formed of, for example, Nb is formed on the interlayer insulating film 20 and the bottom electrode 21 by the sputtering so as to have a thickness of, for example, 5 nm, as shown in FIG. 8B. Of course, Mo or Hf may be used instead of Nb.

Next, a metal nitride film 23 of NbN having a thickness of, for example, 1 nm is formed by heating a surface portion of the metal film 22 at some hundreds of degrees and nitriding the surface portion by plasma nitridation, etc., as shown in FIG. 8C. The buffer layer comprising the metal nitride film 23 of good crystallinity is thereby formed on the metal film 22.

A device shown in, for example, FIG. 9 may be employed for the sputtering and nitridation. In this device, a first chamber 100 provided for the sputtering and a second chamber 200 provided for nitridation are connected with each other via a gate valve 300.

The first chamber 100 is provided to form a metal film by the sputtering, and a stage 110 on which a substrate 120 is placed is contained in the chamber 100. Metal targets 131, 132 and 133 serving as sputter sources are arranged at upper portions inside the chamber 100. The target 131 is Nb serving as a buffer layer, the target 132 is CoFeB which is a ferromagnet, and the target 133 is MgO which is a nonmagnetic tunnel barrier. By selectively subjecting the targets 131, 132 and 133 to RF sputtering in an Ar gas atmosphere, various types of metal films can be formed on the substrate 120.

The second chamber 200 is provided to nitride a metal film, and the stage 110 on which the substrate 120 is placed is contained in the chamber 200. An electrode 210 which can apply an RF power is arranged at an upper portion inside the second chamber 200. Furthermore, gas of NH3, etc. is introduced into the chamber 200 from a gas supply port, and the gas inside the chamber 200 is discharged through a discharge port. N plasma is generated by applying the RF power to the electrode 210 in a state in which the gas is introduced into the chamber 200, and the surface of the substrate 120 can be thereby subjected to plasma nitridation.

In addition, the nitridation subsequent to the formation of metal films can be executed without exposing the metal film to air, by connecting the first chamber 100 and the second chamber 200 via the gate valve 300.

In the step shown in FIG. 8B, this device is employed, and the metal film 22 formed of Nb is formed by arranging the substrate 120 in the first chamber and sputtering the target 131. After the metal film 22 is formed, the gate valve 300 is opened and the stage 110 on which the substrate 120 is placed is moved into the second chamber 200. In the step shown in FIG. 8C, the metal nitride film 23 formed of NbN is formed by carrying out the plasma nitridation in the second chamber 200. Since the metal nitride film 23 is formed by the nitridation of the metal film 22, the crystallinity of the metal nitride film 23 is preferable, and enhancement of the crystallinity of the metal nitride film serving as the buffer layer can be attempted.

Next, the CoFeB film 31 which is to be a recording layer of the MTJ element, the MgO film 32 which is to be a tunnel barrier layer, and the CoFeB film 33 which is to be a reference layer, are formed on the metal nitride film 23 by the sputtering using the device shown in FIG. 9, as shown in FIG. 8D. In other words, the layered structure for formation of the MTJ element is formed by sandwiching the nonmagnetic tunnel barrier layer between the ferromagnetic layers.

The formation of the films 22, 31, 32 and 33 using the sputtering does not need to be executed in the same chamber, but the films may be formed in independent chambers.

Next, the MTJ element 30 is formed by processing the layer portions 22, 23, 31, 32 and 33 in cell pattern as shown in FIG. 8E. More specifically, a mask of the cell pattern is formed on the CoFeB film 33, and the layer portions are subjected to selective etching so as to be left in an insular shape on the bottom electrode 21.

Then, after the interlayer insulating film 40 is formed, the contact plugs 35 and 36 are formed, interconnects 51 and 52 are formed, and the structure shown in FIG. 6 is thereby obtained.

Thus, according to the present embodiment, the crystallinity of the buffer layer 24 can be enhanced since the metal film 22 and the metal nitride film 23 of good crystallinity which can be obtained by nitriding the metal film 22 are used as the buffer layers which become the base of the MTJ element 30. For this reason, enhancement of the magnetic property of the MTJ element 30 can be attempted, and a high MR ratio can be obtained.

(Modified Embodiment)

The invention is not limited to the above-described embodiments.

The method of nitriding the metal film is not limited to plasma nitridation using $NH_3$ gas, but may be plasma nitridation using $N_2O$ gas. In other words, thermal treatment may be executed in a reactive gas atmosphere including N and H, N and O or the like. In addition, N radical may be generated discharge in a chamber different from the chamber for nitridation, and the N radical may be introduced into the chamber to execute the nitridation.

Materials of the metal film for formation of the metal nitride film serving as the buffer layer are not limited to Nb, Mo and Hf, but materials which can suppress the diffusion to the upper layer side of the MTJ element and which has a low standard electrode potential are desirable. For example, Al, Ga, In, Ta and Nb that allow the nitride film to have a hcp-ZnO type crystalline structure, Sc, Ti, V, Cr, Y, Zr, Mo, La, Hf, Nd, Sm, Gd, Tb, and Dy that allow the nitride film to have an NaCl type crystalline structure, and Cu, Zn, Ta, WTa, W, Zn, Cu, V, Cr, Zr, Al, Ti, Sc, Y, La, Ga, In, Nd, Sm, Gd, Tb and Dy can also be used. In addition, their alloys, etc. can also be used. In particular, a nitride film of a metal in group 3 of the periodic table which is chemically stable with trivalent N atoms, a nitride of metal in group 13 of the periodic table which is chemically stable similarly to N atoms, or a nitride of metal which has a great atomic number with a great atomic radius and which has a great diffusion suppression effect of a metal element of the base, is desirable.

The material of the bottom electrode is not limited to Ta, but a material which can preferably be buried in the contact hole and which has a sufficient conductivity is desirable, and W, TiN, and Cu can be used other than Ta.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a magnetoresistive memory device, the method comprising:
   forming a metal buffer layer on a substrate;
   forming a metal nitride buffer layer on the metal buffer layer by nitriding the metal buffer layer;
   forming a magnetoresistive element comprising a magnetic layer on the metal nitride buffer layer; and
   etching the magnetoresistive element selectively up to the metal buffer layer.

2. The method of claim 1, wherein the metal buffer layer is crystalline.

3. The method of claim 1, wherein the metal nitride buffer layer and the metal buffer layer contain a same material.

4. The method of claim 3, wherein the nitriding the metal buffer layer is to execute thermal treatment in an atmosphere containing N radical.

5. The method of claim 3, wherein the nitriding the metal buffer layer is to execute thermal treatment in a reactive gas atmosphere containing N and H, or N and O.

6. The method of claim 1, wherein the forming the metal buffer layer and the forming the magnetoresistive element are executed by sputtering.

7. The method of claim 1, wherein the magnetoresistive element is formed by sandwiching a nonmagnetic layer between the magnetic layers.

8. The method of claim 1, wherein the metal buffer layer contains at least one of Nb, Mo and Hf.

9. The method of claim 1, wherein
   the substrate comprises a semiconductor substrate, an interlayer insulating film formed on the semiconductor substrate, and a bottom electrode buried in the interlayer insulating film, and
   the interlayer insulating film is formed on the semiconductor substrate before forming the metal buffer layer and, further, the bottom electrode is buried in the contact hole after forming a contact hole in the interlayer insulating film.

10. The method of claim 9, wherein the forming the metal buffer layer is to form the metal buffer layer on the bottom electrode.

11. The method of claim 9, further comprising:
    forming a select transistor on the semiconductor substrate, wherein the forming the contact hole is to form a contact hole for connection to one of a source and a drain of the select transistor.

* * * * *